(12) United States Patent
Ueno et al.

(10) Patent No.: US 8,767,477 B2
(45) Date of Patent: Jul. 1, 2014

(54) NON-VOLATILE SEMICONDUCTOR MEMORY DEVICE

(71) Applicant: Kabushiki Kaisha Toshiba, Minato-ku (JP)

(72) Inventors: Koki Ueno, Yokohama (JP); Eietsu Takahashi, Yokohama (JP); Shigefumi Irieda, Yokohama (JP); Yasuhiro Shiino, Yokohama (JP); Manabu Sakaniwa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/864,660

(22) Filed: Apr. 17, 2013

(65) Prior Publication Data
US 2013/0229873 A1 Sep. 5, 2013

Related U.S. Application Data

(63) Continuation of application No. 13/280,618, filed on Oct. 25, 2011, now Pat. No. 8,446,777.

(30) Foreign Application Priority Data

Apr. 20, 2011 (JP) .................................. 2011-94399

(51) Int. Cl.
*G11C 16/06* (2006.01)
*G11C 16/04* (2006.01)

(52) U.S. Cl.
USPC ............ 365/185.24; 365/185.19; 365/185.22; 365/185.28; 365/185.29; 365/185.3

(58) Field of Classification Search
USPC ........................................ 365/185.29, 185.24
See application file for complete search history.

(56) References Cited

U.S. PATENT DOCUMENTS

| | | | |
|---|---|---|---|
| 7,486,564 B2 | 2/2009 | Hemink et al. | |
| 7,495,954 B2 | 2/2009 | Ito | |
| 7,532,520 B2 | 5/2009 | Yanagidaira et al. | |
| 7,606,100 B2 | 10/2009 | Hemink et al. | |
| 7,738,303 B2 | 6/2010 | Park | |
| 7,787,299 B2 | 8/2010 | Won et al. | |
| 7,830,717 B2 * | 11/2010 | Won et al. ................ | 365/185.17 |
| 7,839,690 B2 | 11/2010 | Lee et al. | |
| 7,907,463 B2 * | 3/2011 | Edahiro et al. ................ | 365/218 |

(Continued)

FOREIGN PATENT DOCUMENTS

| | | |
|---|---|---|
| JP | 2000-236031 | 8/2000 |
| JP | 2009-301616 | 12/2009 |

*Primary Examiner* — Son Mai
(74) *Attorney, Agent, or Firm* — Oblon, Spivak, McClelland, Maier & Neustadt, L.L.P.

(57) ABSTRACT

A non-volatile semiconductor memory device according to one embodiment of the present invention includes a memory cell array and a control unit. The control unit is configured to control a repeat of an erase operation, an erase verify operation, and a step-up operation. The control unit is configured to perform a soft-programming operation of setting the memory cells from an over-erased state to a first threshold voltage distribution state when, in a series of erase operations, the number of erase voltage applications is more than a first number and less than a second number (the first number<the second number). The control unit is configured not to perform the soft-programming operation when the number of erase voltage applications is equal to or less than the first number or equal to or more than the second number.

18 Claims, 14 Drawing Sheets

(56) References Cited

U.S. PATENT DOCUMENTS

| | | | |
|---|---|---|---|
| 7,978,520 B2 | 7/2011 | Mokhlesi et al. | |
| 7,995,392 B2 * | 8/2011 | Shibata | 365/185.18 |
| 8,023,330 B2 * | 9/2011 | Kim et al. | 365/185.19 |
| 8,036,035 B2 | 10/2011 | Moschiano et al. | |
| 8,130,551 B2 * | 3/2012 | Oowada et al. | 365/185.19 |
| 8,379,445 B2 * | 2/2013 | Shibata et al. | 365/185.03 |
| 8,498,163 B2 * | 7/2013 | Yang | 365/185.29 |
| 2009/0244969 A1 | 10/2009 | Maejima | |
| 2010/0046305 A1 | 2/2010 | Aritome | |
| 2011/0013460 A1 | 1/2011 | Dong et al. | |
| 2011/0176362 A1 | 7/2011 | Shibata et al. | |
| 2012/0044764 A1 | 2/2012 | Nakai et al. | |
| 2012/0106257 A1 | 5/2012 | Shiino et al. | |

* cited by examiner

Non-Volatile Semiconductor Memory Device

NON-VOLATILE SEMICONDUCTOR MEMORY DEVICE

CROSS REFERENCE TO RELATED APPLICATION

This application is a continuation of U.S. application Ser. No. 13/280,618 filed Oct. 25, 2011, and is based upon and claims the benefit of priority from prior Japanese Patent Application No. 2011-94399, filed on Apr. 20, 2011, the entire contents of each of which are incorporated herein by reference.

BACKGROUND

1. Field

The embodiments described herein relate to an electrically rewritable non-volatile semiconductor memory device.

2. Description of the Related Art

NAND type flash memories are known as electrically rewritable semiconductor memory devices that are capable of a high degree of integration. In a NAND type flash memory, a NAND cell unit is configured by a plurality of memory cells that are connected in series such that a source diffusion layer of one memory cell is shared as a drain diffusion layer of its adjoining memory cell. Both ends of the NAND cell unit are connected to a bit line and a source line respectively through select gate transistors. Such a configuration of the NAND cell unit realizes a smaller unit cell area and a larger memory capacity than those realized in a NOR type memory.

A memory cell of a NAND type flash memory includes a charge accumulation layer (a floating gate electrode) formed above a semiconductor substrate via a tunnel insulating film, and a control gate electrode stacked above the charge accumulation layer via an inter-gate insulating film. The memory cell stores data in a nonvolatile manner according to a charge accumulation state of the floating gate electrode. For example, the memory cell executes binary data storage in which a high threshold voltage state with charges injected in the floating gate electrode is represented by data "0" and a low threshold voltage state with charges discharged from the floating gate electrode is represented by data "1". Recent memory cells also store multi-value data such as four-value data, eight-value data, and so on, by subdividing the threshold voltage distributions to be written.

A data erase operation of the NAND type flash memory is performed on a block basis. The data erase operation is performed by setting all word lines in the selected block to 0 V, and applying the p-type well in which a memory cell array is formed with a boosted positive erase voltage (for example, 18 V to 20 V). A negative threshold voltage state (an erased state) is thus provided in which charges of the floating gate electrodes are discharged in all memory cells in the selected block. Further, in the data erase of the NAND type flash memory, a verify read (an erase verify operation) may be performed to determine whether the erased state is provided. If the erase verify operation determines that the erase is insufficiently performed, the erase voltage is stepwise raised (stepped up) and the same erase operation and erase verify operation are repeated.

A scheme is known that performs the so-called soft-programming operation to eliminate the over-erased state of the memory cell after the batch erase operation. The soft-programming operation can decrease the width of the threshold voltage distribution after the erase operation. Thus, in the subsequent write operation, the desired threshold voltage can be accurately written in the memory cell.

Repeated write/erase operations on the memory cell result in a degraded tunnel insulating film. When the erase operation and the soft-programming operation are performed without consideration of the memory cell degradation, the erase operation and the soft-programming operation may not be accurately performed in the memory cell.

DETAILED DESCRIPTION

Figure 1:
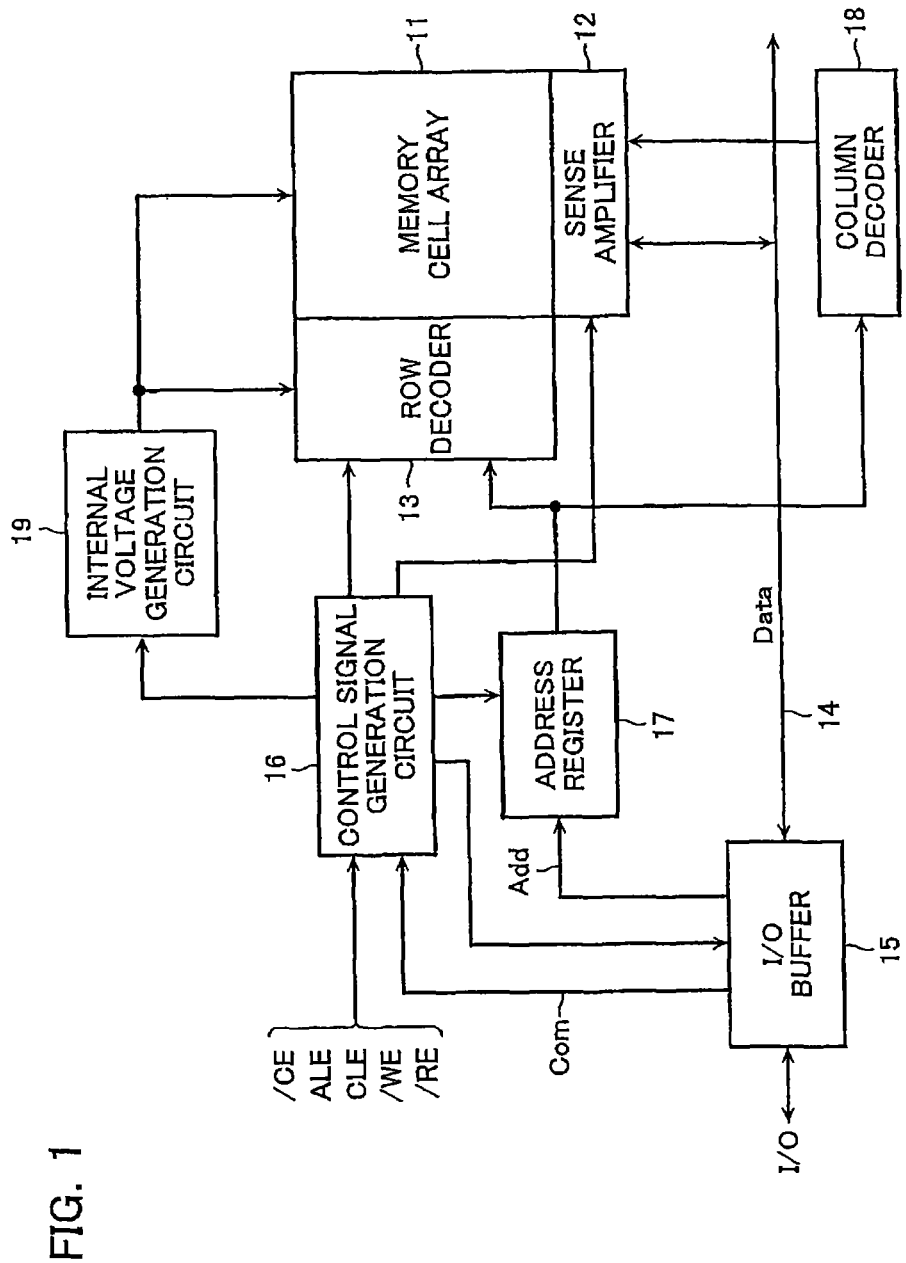
FIG. 1 is a block diagram of the schematic configuration of a non-volatile semiconductor memory device according to an embodiment.

A non-volatile semiconductor memory device according to one embodiment of the present invention includes a memory cell array and a control unit. The memory cell array includes a memory string including a plurality of memory cells connected in series, a first select transistor connected to one end of the memory string, a second select transistor connected to the other end of the memory string, a bit line connected to the memory string via the first select transistor, a source line connected to the memory string via the second select transistor, and word lines connected to control gate electrodes of the memory cells, respectively. The control unit is configured to control a repeat of an erase operation, an erase verify operation, and a step-up operation. The erase operation is an operation of applying an erase voltage to the memory cells for data erase. The erase verify operation is an operation of determining whether the data erase is completed. The step-up operation is an operation of raising the erase voltage by a first step-up value when the data erase is not completed. The control unit is configured to perform a soft-programming operation of setting the memory cells from an over-erased state to a first threshold voltage distribution state when, in a series of erase operations, the number of erase voltage applications is more than a first number and less than a second number (the first number<the second number). The control unit is configured not to perform the soft-programming operation when the number of erase voltage applications is equal to or less than the first number or equal to or more than the second number.

Referring now to the drawings, a non-volatile semiconductor memory device according to the embodiments will be described below.

First Embodiment

Figure 2:
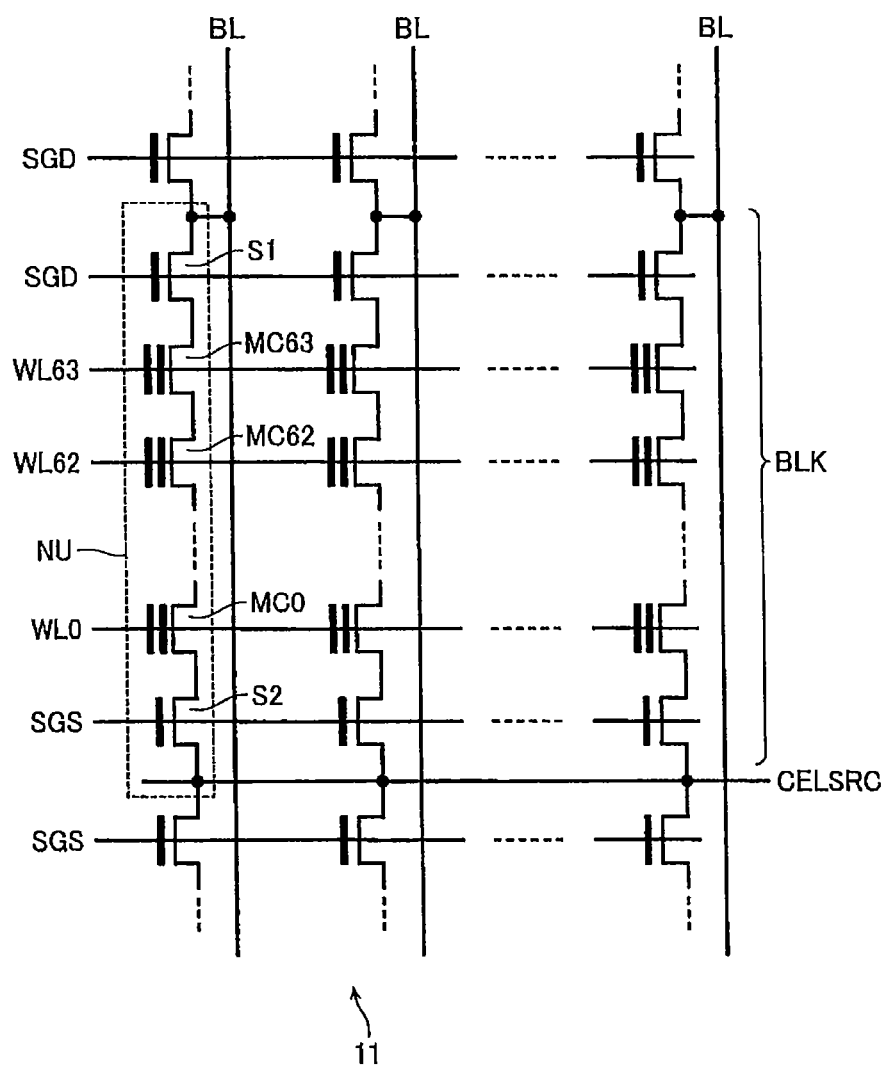
FIG. 2 is a circuit diagram of the configuration of a memory cell array of a non-volatile semiconductor memory device according to an embodiment.

Configuration of Non-Volatile Semiconductor Memory Device According to First Embodiment FIG. 1 is a block diagram of the configuration of a NAND type flash memory according to a first embodiment. FIG. 2 is an equivalent circuit diagram of a memory cell array of the NAND type flash memory according to the first embodiment.

With reference to FIG. 2, the memory cell array 11 includes NAND cell units NU in a matrix arrangement. Each NAND cell unit NU includes a plurality of electrically rewritable non-volatile memory cells MC0 to MC63 (64 memory cells in the example in FIG. 2) connected in series, and select gate transistors S1 and S2 to connect the ends of the NAND cell unit NU to a bit line BL and a common source line CELSRC, respectively. It is assumed here that each memory cell MC has a p-type well formed on a semiconductor substrate and a stack gate structure that has a gate-insulating film, a floating gate electrode, an inter-gate insulating film, and a control gate electrode stacked on the p-type well.

The memory cells MC in each NAND cell unit NU have control gates connected to different word lines WL0 to WL63. The select gate transistors S1 and S2 have gates connected to respective select gate lines SGD and SGS. A set of NAND cell units NU sharing one word line provides a block as a basis of data erase. With reference to FIG. 2, a plurality of blocks BLK are disposed in the bit line direction. The bit lines BL are connected to a sense amplifier 12 as described below. The memory cells MC commonly connected to one word line WL provide one page.

With reference to FIG. 1, the sense amplifier 12 is disposed in the bit line direction of the memory cell array 11 and is connected to the bit lines BL to read data on a page basis. The sense amplifier 12 functions as a data latch of holding 1-page write data. That is, the read and write are performed on a page basis. The sense amplifier 12 is associated with a data cache for temporarily holding input/output data and a column selection circuit for a column selection.

A row decoder 13 is disposed in the word line direction of the memory cell array 11. The row decoder 13 selectively drives, according to row addresses, the word lines WL and the select gate lines SGD and SGS. The row decoder 13 includes a word line driver and a select gate line driver. Further, a column decoder 18 for controlling a column selection circuit in the sense amplifier 12 is associated with the sense amplifier 12. The row decoder 13, the column decoder 18, and the sense amplifier 12 provide a read/write circuit for data read and write to the memory cell array 11.

Between an external input/output port I/O and the sense amplifier 12, data transfer is performed by an input/output buffer 15 and a data line 14. Specifically, page data read by the sense amplifier 12 is output to the data line 14, and is then output to the input/output port I/O via the input/output buffer 15. Write data supplied from the input/output port I/O is loaded to the sense amplifier 12 via the input/output buffer 15.

Address data Add supplied from the input/output port I/O is supplied to the row decoder 13 and the column decoder 18 via an address register 17. Command data Com supplied from the input/output port I/O is decoded and set in a control signal generation circuit 16.

External control signals of a chip enable signal/CE, an address latch enable signal ALE, a command latch enable signal CLE, a write enable signal/WE, and a read enable signal/RE are each supplied to the control signal generation circuit 16. The control signal generation circuit 16 controls, according to the command Com and the external control signals, the operation of the general memory operations as well as an internal voltage generation circuit 19 to generate various internal voltages necessary for the data read, data write, and data erase. These peripheral circuits provide a control unit of a non-volatile semiconductor memory device according to the embodiment.

[Data Storage]

Figure 3A:
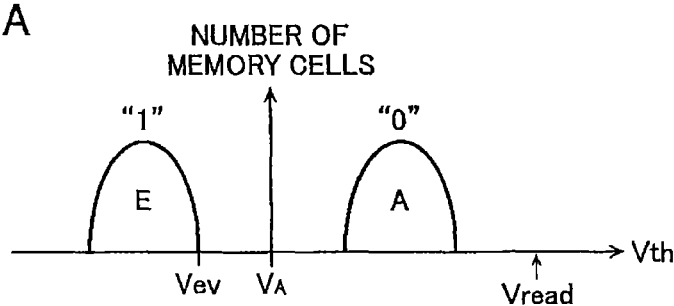
FIG. 3A shows an example of data storage in a non-volatile semiconductor memory device according to an embodiment.
Figure 3B:
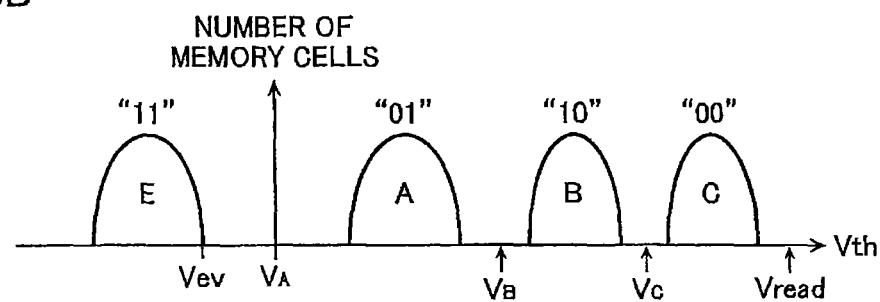
FIG. 3B shows an example of data storage in a non-volatile semiconductor memory device according to an embodiment.

Referring now to FIG. 3A and FIG. 3B, the data storage scheme of the non-volatile semiconductor memory device will be generally described. FIG. 3A and FIG. 3B each show the relationship between data stored in the memory cell MC and threshold voltages.

FIG. 3A shows the relationship between data ("1" and "0") and threshold voltage distributions for a memory cell MC storing 1-bit data (2-value data). FIG. 3B shows the relationship between data ("11," "01," "10," and "00") and threshold voltage distributions for a memory cell MC storing 2-bits data (4-value data). The threshold voltage distribution E of the memory cell MC after block erase is assigned with data "1" or "11." Threshold voltage distributions A, B, and C are assigned with write data.

Note that, in FIG. 3A and FIG. 3B, the read voltages VA, VB, and VC are each a voltage applied to the control gate (the selected word line WL) of the selected memory cell MC selected in the data read. In the data read, a read pass voltage Vread is applied to the control gates of the unselected memory cells MC (the unselected word lines WL) and indicates, regardless of the held data, a voltage to render the unselected memory cells MC conductive. A voltage Vev is an erase verify voltage that is applied to the memory cell MC to determine whether the erase is completed in the data erase of the memory cell MC. The voltage Vev is, for example, a negative voltage (Vev<0 V). The above voltages have a magnitude relation of Vev<VA<VB<VC<Vread.

[Write Operation]

The write operation is performed on a page basis. Before the write operation, the bit line BL and the NAND cell unit NU are precharged depending on the write data. Specifically, when data is written (the threshold voltage is shifted toward positive values), 0 V is applied from the sense amplifier 12 to the bit line BL. The bit line voltage is transferred to the channel of the memory cell MC connected to the selected word line WL via the select gate transistor S1 and the unselected memory cells MC. The selected word line WL in the selected block BLK is then applied with a write voltage (about 20 V). As a result, charges are injected from the channel of the selected memory cell MC into the floating gate electrode, thereby shifting the threshold voltage of the memory cell MC to positive values.

When the selected memory cell MC is not written with data, the bit line BL is applied with the power supply voltage Vdd. After the bit line voltage is transferred to the channel of the NAND cell unit NU, the channel becomes floating. When the above write voltage is applied, the channel voltage is increased by capacitance coupling, thereby not injecting charges into the floating gate electrode. Therefore, the threshold voltage of the memory cell MC remains unchanged.

[Read Operation]

The data read is performed by providing a read voltage to the word line WL (the selected word line) connected to the selected memory cell MC in the NAND cell unit NU. In contrast, the word lines WL (the unselected word lines) connected to the unselected memory cells MC are applied with the read pass voltage Vread (about 4 V). In so doing, the sense amplifier 12 detects whether a current flows in the NAND cell unit NU, thereby determining data.

[Erase Operation]

Figure 4:
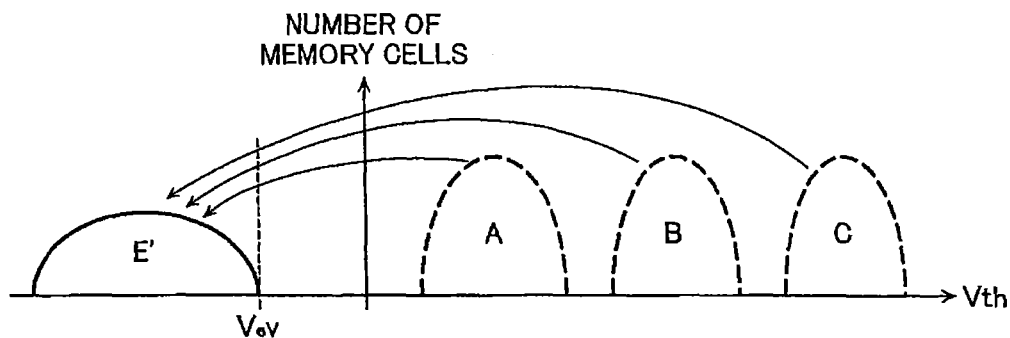
FIG. 4 illustrates threshold voltage distributions in an erase operation according to an embodiment.
Figure 5:
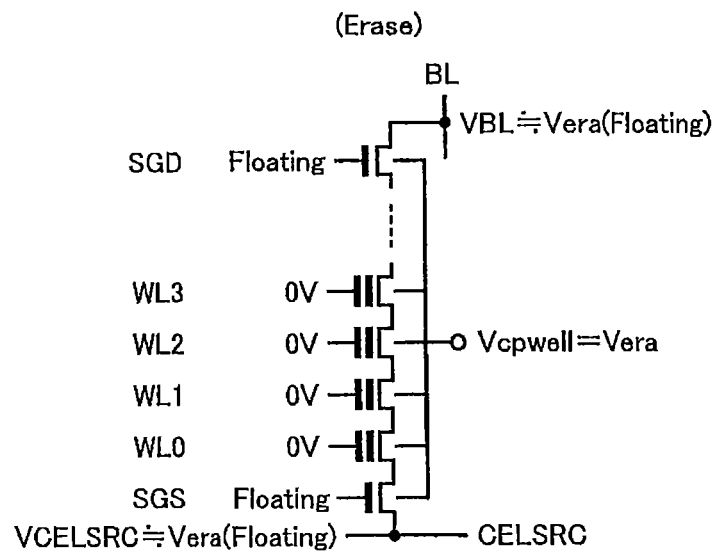
FIG. 5 illustrates voltages during an erase operation according to an embodiment.
Figure 6:
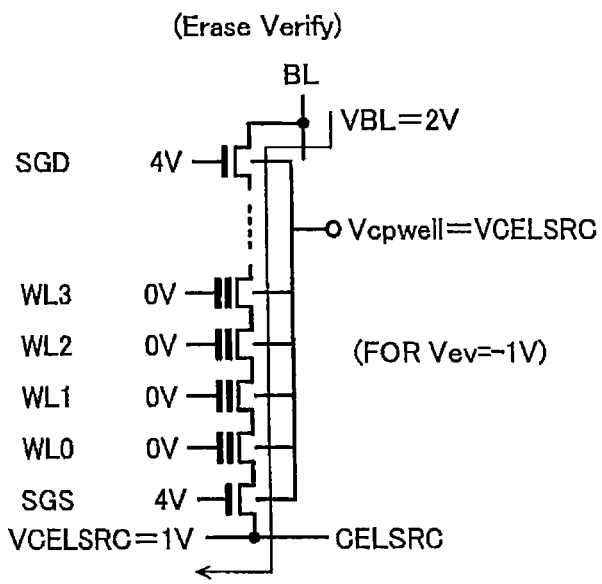
FIG. 6 illustrates voltages during an erase verify operation according to an embodiment.

FIG. 4 illustrates threshold voltage distributions during the erase operation. FIG. 5 and FIG. 6 illustrate voltages applied during the erase operation and the erase verify operation, respectively. As described above, the erase operation is performed on a block basis. Here, erasing the memory cells MC in the selected block BLK may be referred to as erasing the block. With reference to FIG. 5, a cell well (CPWELL) is applied with an erase voltage Vera (20 V or more) and all word lines WL in the selected block are applied with 0 V. Charges of the floating gate electrode of each memory cell MC are thus drawn to the cell well, thereby reducing the threshold voltage of each memory cell MC. In so doing, in order not to break down the gate oxide films of the select gate transistors S1 and S2, the select gate lines SGD and SGS are left floating. The bit line BL and the source line CELSRC are also left floating. The threshold voltages of the memory cell MC are thus shifted toward negative values as shown in FIG. 4.

[Erase Verify Operation]

In the data erase operation, after the erase voltage Vera is applied, a verify read operation (the erase verify operation) is performed to determine that the threshold voltage of the memory cell MC is equal to or less than the erase verify voltage Vev.

FIG. 6 shows an example of reading whether the memory cell MC is erased to the threshold voltage Vev (for example −1 V). The erase verify operation is performed by applying the source line CELSRC with a voltage of 1 V, all word lines of the selected block with 0 V, and the bit line BL with 2 V. The select gate lines SG1 and SG2 are applied with a certain voltage (for example 4 V) to render the select gate transistors conductive. FIG. 6 shows an example voltage application of the negative sense scheme to apply the source line CELSRC with a certain voltage. The negative sense scheme provides reading state similar to that by applying the selected word line WL with a negative voltage. The erase verify operation is not limited to the voltage values shown in FIG. 6. It may be any voltage value that allows detecting that the threshold voltage of the memory cell MC is equal to or less than the erase verify voltage Vev.

When the voltage application shown in FIG. 6 draws a current from the bit line BL and voltage reduction of the bit line BL is detected, it means that all memory cells MC in the NAND cell unit NU are sufficiently erased. The erase operation is thus ended. When the bit line voltage is held, it means that an insufficiently erased cell exists. The erase operation is thus performed again.

The erase operation is performed again after the erase voltage Vera is set to a voltage higher by a step-up value ΔVera (>0) than the voltage Vera (a step-up operation). Then, the erase operation, the erase verify operation, and the step-up operation are repeated until the data erase is completed. Every time the operations are repeated, the erase voltage Vera is incremented by the ΔVera.

As described above, the erase operation of the NAND type flash memory is the erase operation of all memory cells MC in a block at once. It is thus hard to control the threshold voltage of each memory cell MC to an appropriate value. To address this, a soft-programming operation performed on the memory cell MC subjected to the erase operation may suppress the dispersion of the threshold voltage of the memory cell MC.

[Soft-Programming Operation]

Figure 7:
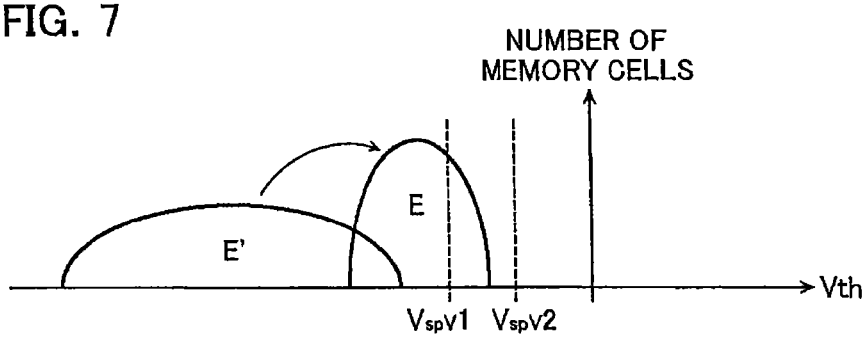
FIG. 7 illustrates threshold voltage distributions during the soft-programming operation according to an embodiment.

FIG. 7 illustrates the threshold voltage distributions during the soft-programming operation. In the above erase operation, the lower limit value of the threshold voltage distribution is usually not controlled. Thus, the threshold voltage distribution of the memory cells MC subjected to the erase operation is like the threshold voltage distribution E' as shown in FIG. 4 and FIG. 7. In this case, the NAND cell unit NU may include an over-erased memory cell MC. If any threshold voltage difference exists between the memory cells MC, capacitance coupling between the adjacent memory cells MC may cause any data change (erroneous write) in the subsequent operations. Therefore, in order to eliminate the over-erased state, all memory cells MC are subjected to the soft-programming operation that uses a weak write condition, i.e., a soft-programming voltage Vsp (for example, 10 V to 15 V) lower than the normal write voltage (for example, 15 V to 20 V). Thus, the threshold voltage distribution of the memory cells MC becomes a distribution like the threshold voltage distribution E as shown in FIG. 7. The soft-programming operation may totally reduce the range of the threshold voltage distribution of the memory cells MC.

A soft-programming verify operation is performed after the soft-programming operation. The soft-programming verify operation is executed as an operation of determining whether the threshold voltages of a certain number of memory cells MC become more than a first soft-programming verify voltage Vspv1. When the threshold voltages of the certain number of memory cell MC become more than the first soft-programming verify voltage Vspv1 shown in FIG. 7, it is determined that the first soft-programming verify is passed. Note that the first soft-programming verify voltage Vspv1 may be more than or the same as the erase verify voltage.

When the number of memory cells MC exceeding the first soft-programming verify voltage Vspv1 is less than certain number, it means that the soft-programming operation is performed insufficiently. The soft-programming operation is thus performed again. The soft-programming operation is performed again after the soft-programming voltage Vsp is set to a voltage higher by a step-up value $\Delta$Vsp (>0) than the voltage Vsp (a step-up operation). Then, the soft-programming operation, the soft-programming verify operation, and the step-up operation are repeated. Every time the operations are repeated, the soft-programming voltage Vsp is incremented by the $\Delta$Vsp.

When the soft-programming operation increases the threshold voltage of the memory cell MC too much, the erased state and the write state may not be distinguished. Therefore, it is determined that the soft-programming operation is failed when the threshold voltages of the certain number of memory cells MC become more than a second soft-programming verify voltage Vspv2.

Note that the second soft-programming verify voltage Vspv2 may be set to a value more than the first soft-programming verify voltage Vspv1. Further, the first soft-programming verify voltage Vspv1 and the second soft-programming verify voltage Vspv2 may be set to the same value, and the pass/fail condition of the soft-programming operation may be changed depending on the number of memory cells MC that pass the verify operation.

Figure 8:
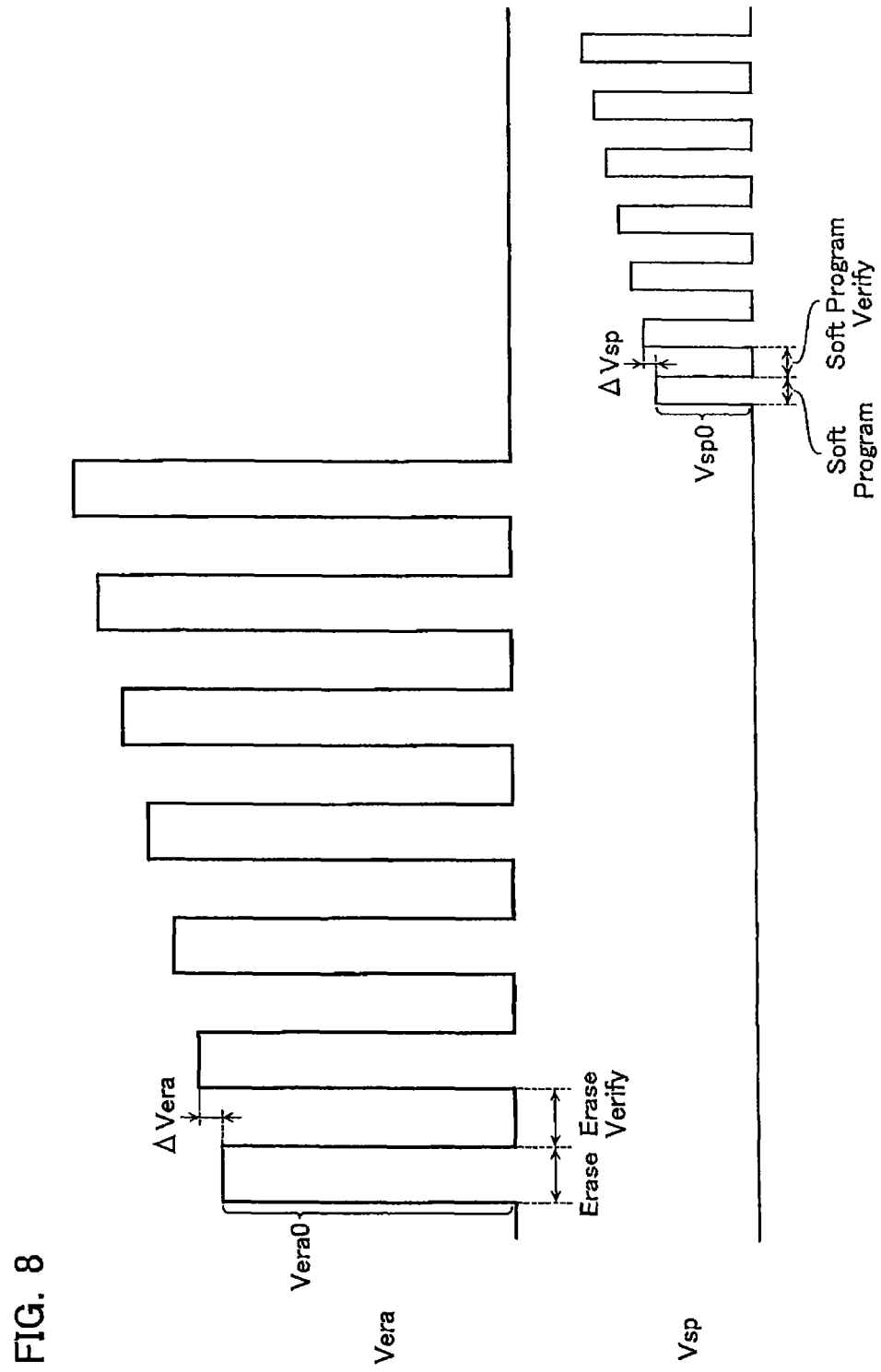
FIG. 8 shows a voltage waveform chart of an erase operation and a soft-programming operation according to a comparative example.

In the following first embodiment, the control of the soft-programming operation will be described. Referring to FIG. 8, the control of the soft-programming operation of a comparative example will be first described. Then, the control of the soft-programming operation according to the first embodiment will be described.

FIG. 8 is a voltage waveform chart of the erase operation, the erase voltage step-up operation, the soft-programming operation, and the soft-programming voltage step-up operation of the comparative example. As described above, the voltage Vera is a voltage applied to the p-type well of a block that is subject to the erase operation, and the voltage Vsp is a voltage applied to a word line WL that is subject to the soft-programming operation. Here, FIG. 8 shows a comparative example where 7 (seven) applications of the erase voltage Vera are followed by the soft-programming operation. The comparative example is shown as performing the erase operation and the soft-programming operation without consideration of the number of erase voltage Vera applications.

Repeated write/erase operations on the memory cell MC result in a degraded tunnel insulating film. A degraded tunnel insulating film makes it hard to discharge charges trapped in the charge accumulation layer during the erase operation, while the degraded film facilitates charges injection and threshold voltage increase of the memory cell MC during the soft-programming operation.

In the data erase operation on one block, it is not preferred that the soft-programming operation is performed from the start despite of only the small number of write/erase operations having been performed. When, for example, the soft-programming operation is performed on a block that experiences only a small number of write/erase operations and that may be accurately erased after only a small number of erase voltage Vera applications, the erase operation of the block may be slowed down.

When, in contrast, the soft-programming operation is performed on a block that experiences a large number of write/erase operations and thus may be written with data more easily, the soft-programming voltage Vsp may inject excessive charges into the memory cell MC. For serious degradation of the gate-insulating film, one soft-programming operation may increase the threshold voltage distribution to a value more than the second soft-programming verify voltage Vspv2. A memory cell MC in an erased state thus returns to a write state, thereby preventing the successful end of the erase operation.

[Erase Operation and Soft-Programming Operation According to First Embodiment]

In this light, the first embodiment adopts a scheme of controlling whether to perform the soft-programming operation. Note that whether to perform the soft-programming operation may depend on the number of erase voltage Vera applications during the erase operation. With reference to FIG. 9 and FIG. 10A to FIG. 10C, the erase operation and the soft-programming operation according to this embodiment will be described blow.

Figure 9:
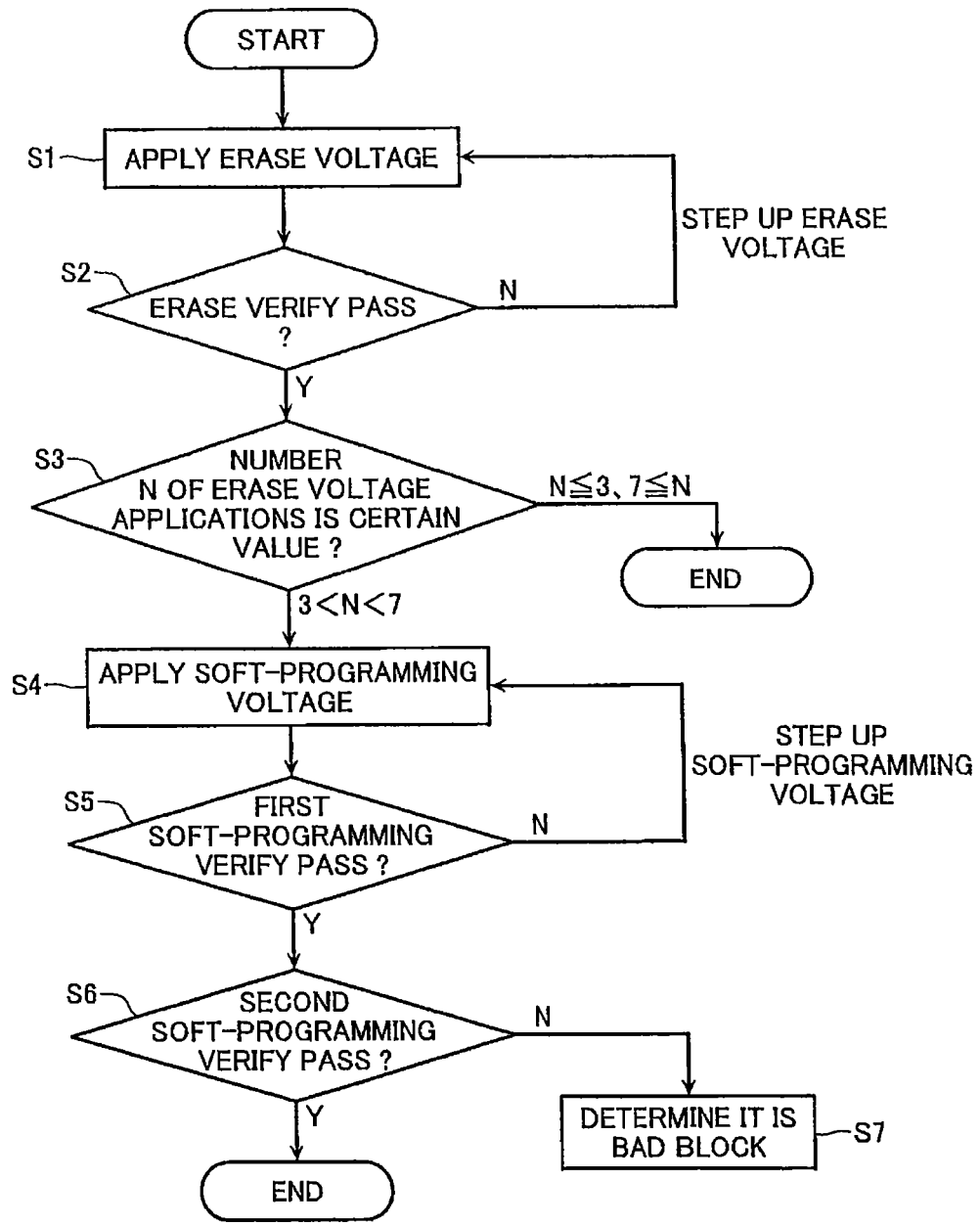
FIG. 9 is a flowchart illustrating an erase operation and a soft-programming operation according to a first embodiment.

FIG. 9 is a flowchart of the procedure of the erase operation and the soft-programming operation according to this embodiment. First, when the erase operation is started, the p-type well including the memory cell MC formed therein is applied with the erase voltage Vera (step S1). Then, the erase verify operation is performed to determine that the threshold voltage of the memory cell MC is equal to or less than the erase verify voltage Vev (step S2). When the erase verify operation determines that an insufficiently erased memory cell MC exists, the erase voltage Vera is set to a voltage higher by a step-up value $\Delta$Vera than the voltage Vera, and the erase voltage Vera is applied again. When the erase verify operation determines that the number of the memory cells MC that have been sufficiently erased is not less than a reference number, the number of previous applications of the erase voltage Vera is read (step S3). The number of erase voltage Vera applications may be counted according to, for example, a signal used by the control signal generation circuit 16.

In the erase operation according to this embodiment, when the number N of erase voltage Vera applications is, for example, N≤3 or 7≥N, the soft-programming operation is not performed and the erase operation is ended. When the number N of erase voltage Vera applications is, for example, 3<N<7, the soft-programming voltage Vsp is applied to perform the soft-programming operation (step S4). Then, a first soft-programming verify operation is performed to determine whether the threshold voltages of a reference number of memory cell MC become more than the first soft-programming verify voltage Vspv1 (step S4). When the soft-programming operation is insufficient, the soft-programming voltage Vsp is set to a voltage higher by a step-up value $\Delta$Vsp than the voltage Vsp to perform the soft-programming operation again.

When the first soft-programming verify operation is passed, a second soft-programming verify operation is performed to determine whether the threshold voltages of a certain number of memory cells MC become more than the second soft-programming verify voltage Vspv2 (step S6). When the threshold voltages of the reference number of memory cells MC become more than the second soft-programming verify voltage Vspv2, it is determined that the block fails to successfully end the erase operation and the soft-programming operation and is a bad block (step S7). When the second soft-programming verify operation is passed, it is determined that the erase operation and the soft-programming operation are correctly performed, and thus the operation is ended.

Figure 10A:
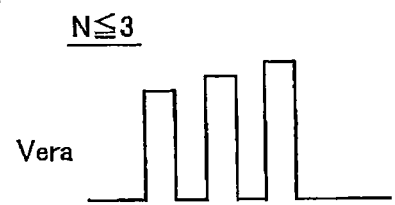
FIG. 10A is a voltage waveform chart of voltages during an erase operation and a soft-programming operation according to the first embodiment.
Figure 10A:
Figure 10B:
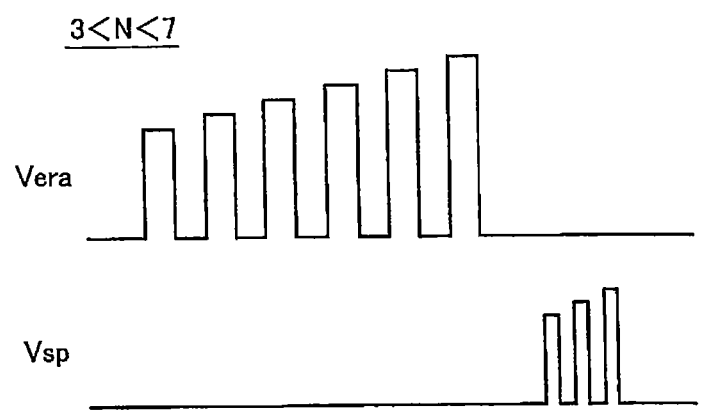
FIG. 10B is a voltage waveform chart of voltages during an erase operation and a soft-programming operation according to the first embodiment.
Figure 10C:
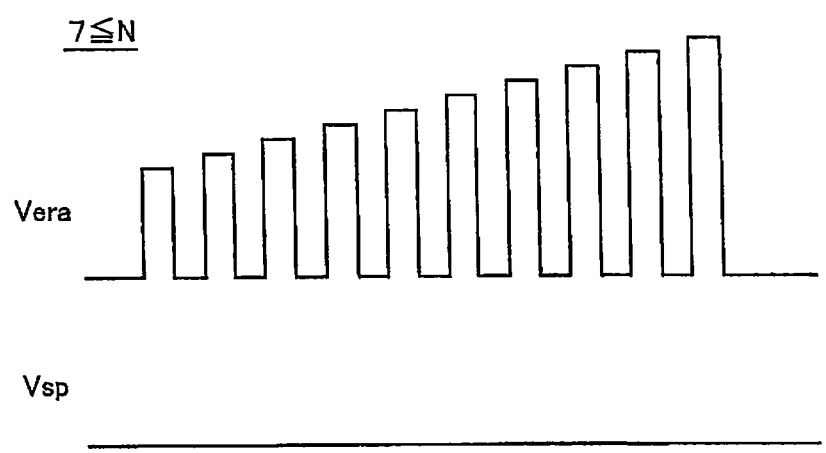
FIG. 10C is a voltage waveform chart of voltages during an erase operation and a soft-programming operation according to the first embodiment.

FIG. 10A to FIG. 10C are voltage waveform charts of the voltages during the erase operation and the soft-programming operation according to the first embodiment. With reference to FIG. 10A and FIG. 10C, when the number N of erase voltage Vera applications is N≤3 or 7≥N, the soft-programming voltage Vsp is not applied and the operation is ended. With reference to FIG. 10B, when the number N of erase voltage Vera applications is 3<N<7, the soft-programming voltage Vsp is applied to perform the soft-programming operation. Referring also to FIG. 10B, during the soft-programming operation, the soft-programming voltage Vsp is stepped up (steps S4 and S5 in the flowchart in FIG. 9).

Note that the above embodiment is described with respect to an example where it is determined whether to perform the soft-programming operation when the number N of erase voltage Vera applications is 3 and 7. The boundary value at which it is determined whether to perform the soft-programming operation is not limited to 3 and 7, and may be any number. The same holds true for the following other embodiments.

[Advantages]

In the erase operation and a soft-programming operation according to this embodiment, the soft-programming operation is not performed on a block that experienced only a small number of write/erase operations and that may be sufficiently accurately erased after only a small number of erase voltage Vera applications. The erase operation may thus be rapidly ended. The soft-programming operation is also not performed on a block that experienced a large number of write/erase operations and thus may be written with data more easily. Accordingly, This may prevent a memory cell MC in an erased state from returning to a write state due to the soft-programming operation. That is, this may prevent an erase operation from ending in failure.

When the number of erase voltage applications is within a certain value, the soft-programming operation may be performed on the memory cell MC subjected to the erase operation to suppress the dispersion of the threshold voltage of the memory cell MC.

Second Embodiment

Referring now to FIG. 11A to FIG. 11C, FIG. 12A to FIG. 12C, and FIG. 13A to FIG. 13C, a non-volatile semiconductor memory device according to a second embodiment will be described. The entire configuration of a non-volatile semiconductor memory device of this embodiment is similar to that in the first embodiment, and thus the detailed description is omitted here. Like elements as those in the first embodiment are designated by like reference numerals, and repeated description thereof is omitted here.

During the erase operation according to the first embodiment, the erase operation is performed without changing the step-up value ΔVera of the erase voltage Vera. In contrast, during the erase operation in this embodiment, the erase operation is performed after changing the step-up value ΔVera of the erase voltage Vera. Note that in this embodiment, when the number of erase voltage Vera applications becomes more than a certain number, the step-up value ΔVera is changed. Referring now to FIG. 11A to FIG. 11C, FIG. 12A to FIG. 12C, and FIG. 13A to FIG. 13C, a description is given below.

FIG. 11A to FIG. 11C, FIG. 12A to FIG. 12C, and FIG. 13A to FIG. 13C are voltage waveform charts of the voltages during the erase operation and the soft-programming operation according to the second embodiment. With reference to FIG. 11A, FIG. 12A, FIG. 13A, FIG. 11C, FIG. 12C, and FIG. 13C, also in this embodiment, when the number N of erase voltage Vera applications is N≤3 or 7≥N, the soft-programming voltage Vsp is not applied and the operation is ended. In contrast, with reference to FIG. 11B, FIG. 12B, and FIG. 13B, when the number N of erase voltage Vera applications is 3<N<7, the soft-programming voltage Vsp is applied to perform the soft-programming operation.

Figure 11A:
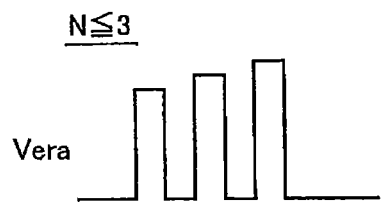
FIG. 11A is a voltage waveform chart of voltages during an erase operation and a soft-programming operation according to a second embodiment.
Figure 11B:
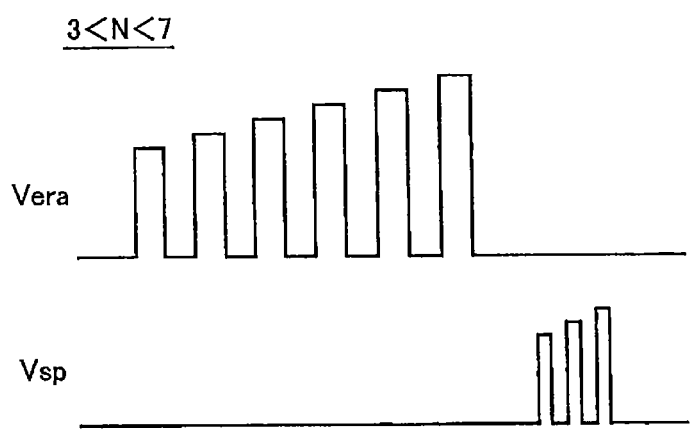
FIG. 11B is a voltage waveform chart of voltages during an erase operation and a soft-programming operation according to the second embodiment.
Figure 11C:
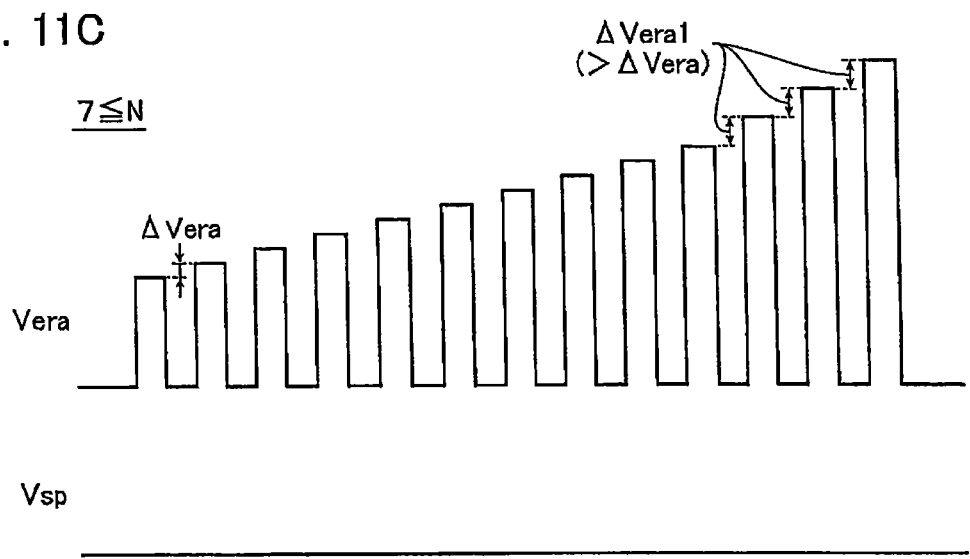
FIG. 11C is a voltage waveform chart of voltages during an erase operation and a soft-programming operation according to the second embodiment.

Here, in this embodiment, with reference to FIG. 11C, at the number of erase voltage Vera applications of 11 or more, the step-up value is changed to ΔVera1 (>ΔVera). When the erase verify operation is not passed even after a large number of erase voltage Vera applications, the range of memory cells MC are being degraded, which makes it hard to discharge charges trapped in the charge accumulation layer. To address this, the step-up value set to the ΔVera1 may increase the potential difference between the charge accumulation layer and the channel, thereby facilitating the discharge of charges.

Figure 12A:
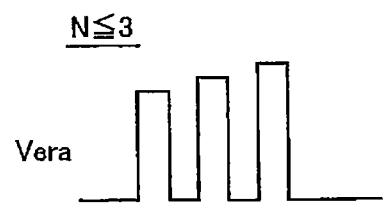
FIG. 12A is a voltage waveform chart of voltages during an erase operation and a soft-programming operation according to the second embodiment.
Figure 12B:
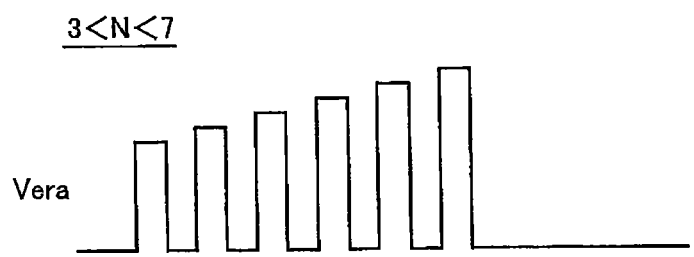
FIG. 12B is a voltage waveform chart of voltages during an erase operation and a soft-programming operation according to the second embodiment.
Figure 12B:
Figure 12C:
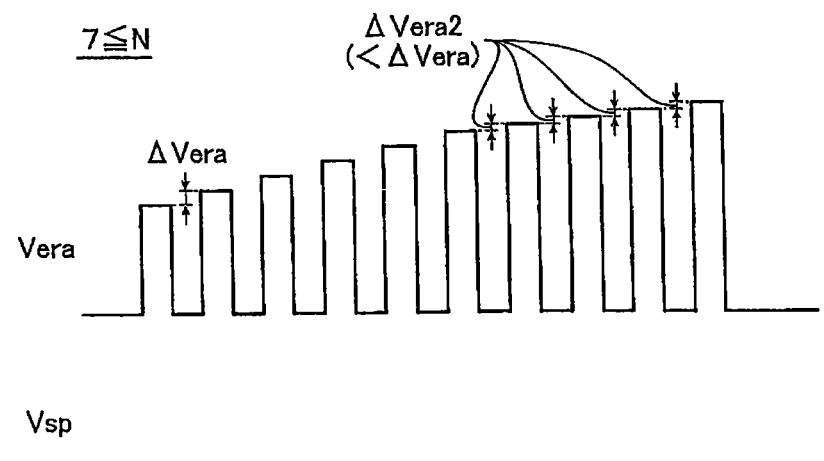
FIG. 12C is a voltage waveform chart of voltages during an erase operation and a soft-programming operation according to the second embodiment.

The step-up value change in this embodiment is not limited to the increase of the step-up value. With reference to FIG. 12C, at the number of erase voltage Vera applications of 7 or more, the step-up value may be changed to ΔVera2 (<ΔVera). A memory cell MC experienced a large number of erase voltage Vera applications is being degraded. Application of a high erase voltage to that memory cell MC may thus further accelerate the degradation. To address this, the step-up value set to the ΔVera2 may not provide a very large potential difference between the charge accumulation layer and the channel. The erase operation may thus be continued while suppressing the degradation of the memory cell MC.

Figure 13A:
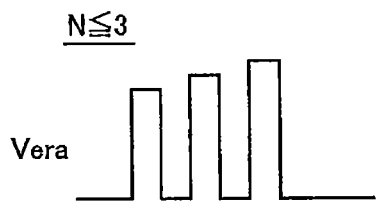
FIG. 13A is a voltage waveform chart of voltages during an erase operation and a soft-programming operation according to the second embodiment.
Figure 13B:
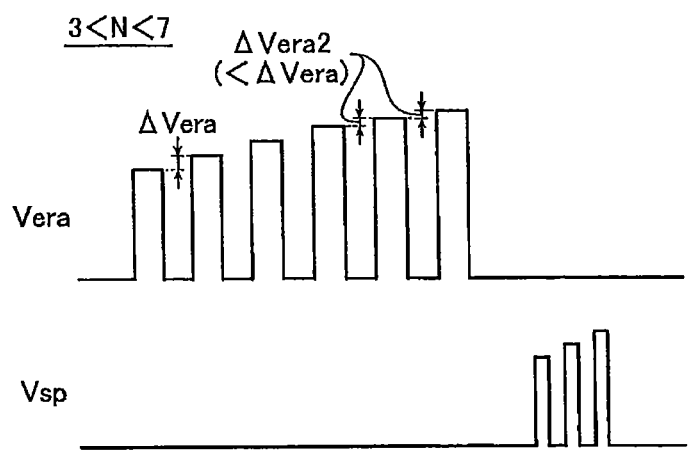
FIG. 13B is a voltage waveform chart of voltages during an erase operation and a soft-programming operation according to the second embodiment.
Figure 13C:
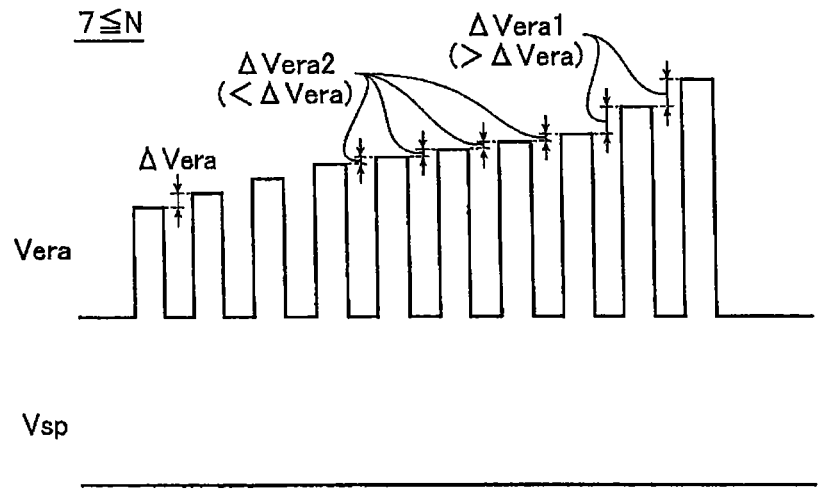
FIG. 13C is a voltage waveform chart of voltages during an erase operation and a soft-programming operation according to the second embodiment.

The change of the step-up value is not limited to one event. With reference to FIG. 13B and FIG. 13C, at the number of erase voltage Vera applications of 5 or more, the step-up value may be changed to the ΔVera2 (<ΔVera), and at the number of 9 or more, the step-up value may be changed to the ΔVera1 (>ΔVera).

[Advantages]

Also in the erase operation and the soft-programming operation according to this embodiment, the soft-programming operation is not performed on a block that experienced only a small number of write/erase operations and that may be erased sufficiently accurately after only a small number of erase voltage Vera applications. The erase operation may thus be rapidly ended. The soft-programming operation is also not performed on a block that experienced a large number of write/erase operations and thus may be written with data more easily. Accordingly, This may prevent a memory cell MC in an erased state from returning to a write state due to the soft-programming operation. That is, this may prevent an erase operation from ending in failure. When the number of erase voltage applications is within a reference value, the soft-programming operation may be performed on the memory cell MC subjected to the erase operation to suppress the dispersion of the threshold voltage of the memory cell MC.

As described above, the step-up value of the erase voltage Vera may be increased or decreased to accelerate the erase operation or suppress the degradation of the memory cell MC during the erase operation. In this case, depending on the purposes of the accelerated erase operation or the suppressed degradation of the memory cell MC, the increase or decrease of the step-up value of the erase voltage Vera may be freely selected. Further, the change timing and the increase or decrease width of the step-up value are not limited to those in the above embodiments. In consideration of the erase operation speed and the effects of suppressing the degradation of the memory cell MC, the change timing and the increase or decrease width of the step-up value may also be freely set.

Third Embodiment

Figure 14A:
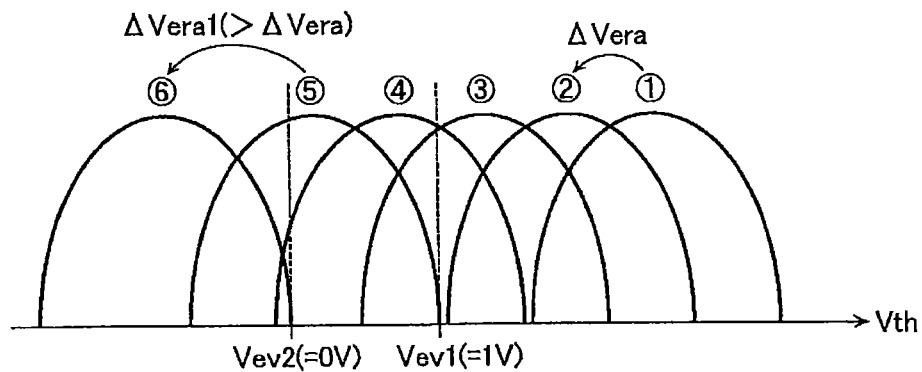
FIG. 14A illustrates threshold voltage distributions during an erase operation according to a third embodiment.
Figure 14B:
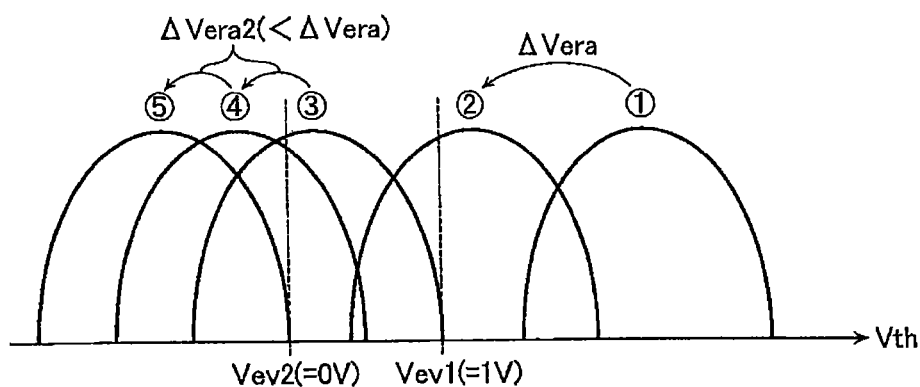
FIG. 14B illustrates threshold voltage distributions during an erase operation according to the third embodiment.

Referring now to FIG. 14A and FIG. 14B, a non-volatile semiconductor memory device according to a third embodiment will be described below. The entire configuration of a non-volatile semiconductor memory device of this embodiment is similar to that in the first embodiment, and thus the detailed description is omitted here. Like elements as those in the first embodiment are designated by like reference numerals, and repeated description thereof is omitted here.

Also in this embodiment, the number of erase voltage Vera applications is used to control whether to apply the soft-programming voltage Vsp to perform the soft-programming operation as in the first and second embodiments. Here, in the erase operation according to the second embodiment, the number of erase voltage Vera applications is used to change the step-up value ΔVera of the erase voltage Vera during the erase operation. In contrast, in this embodiment, when the upper limit of the threshold voltage distribution of the memory cells MC in the erase block becomes less than a reference value, the step-up value ΔVera of the erase voltage Vera is changed. Referring now to FIG. 14A and FIG. 14B, a description is given below.

FIG. 14A and FIG. 14B illustrate the threshold voltage distributions during an erase operation according to the third embodiment. In the above first embodiment, the erase verify operation is performed to determine whether the threshold voltage of the memory cell MC is equal to or less than the erase verify voltage Vev. In contrast, in this embodiment, the erase verify voltage includes two levels of voltages: a voltage Vev1 (for example, 1V) and a voltage Vev2 (for example, 0 V). In the erase operation according to this embodiment, until the upper limit of the threshold voltage distribution of the memory cells MC in the erase block is less than the erase verify voltage Vev1, the step-up value of the erase voltage Vera is set to the ΔVera.

With reference to FIG. 14A, in the erase voltage application operation (from the number 5 to the number 6) after the upper limit of the threshold voltage distribution becomes less than the erase verify voltage Vev1, the step-up value may be changed to the ΔVera1 (>ΔVera). Further, with reference to FIG. 14B, the erase voltage application operation (from the number 3 to number 4 and from the number 4 to number 5) after the upper limit of the threshold voltage distribution becomes less than the erase verify voltage Vev1, the step-up value may be changed to the ΔVera2 (<ΔVera).

[Advantages]

Also in this embodiment, the number of erase voltage Vera applications is used to control whether to apply the soft-programming voltage Vsp to perform the soft-programming operation. This embodiment may thus provide advantages such as described in the above first embodiment.

The erase voltage step-up operation according to this embodiment may also provide the following advantages. With reference to FIG. 14A, when the erase verify operation is not passed even after a large number of erase voltage Vera applications, it means that the range of the memory cells MC are being degraded. More applications of the erase voltage Vera to these memory cells MC facilitate their degradation. To address this, the step-up value set to the ΔVera1 after the upper limit of the threshold voltage distribution becoming less than the erase verify voltage Vev1 may end the erase operation more quickly, thereby suppressing the degradation of the memory cell MC. Also with reference to FIG. 14B, the step-up value set to the ΔVera2 after the upper limit of the threshold voltage distribution becoming less than the erase verify voltage Vev1 may finely adjust the threshold voltage immediately before the erase operation is ended. Therefore, the erase operation may accurately be ended.

Other Example

Figure 14C:
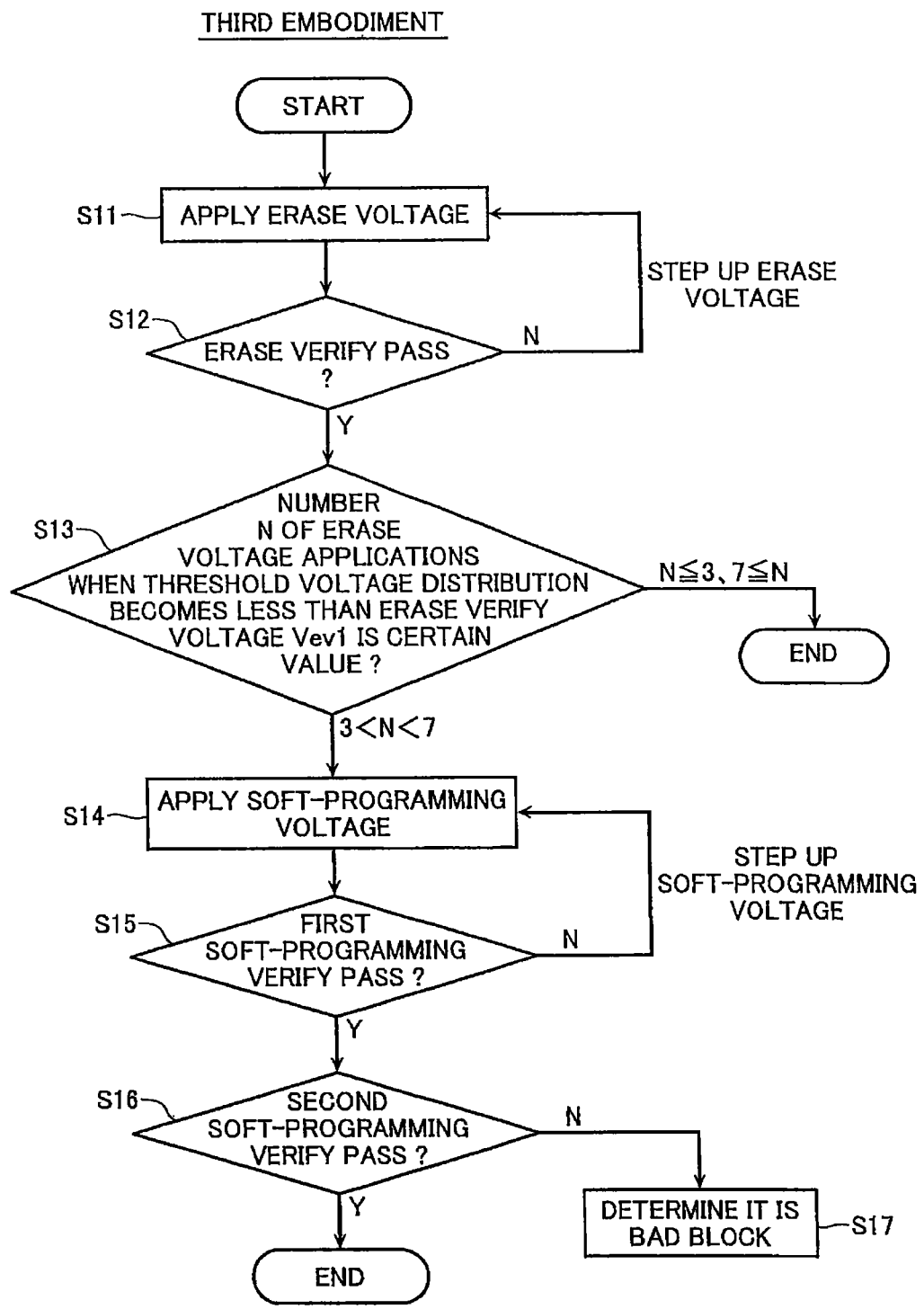
FIG. 14C is a flowchart illustrating an erase operation and a soft-programming operation according to the third embodiment.

The number of erase voltage Vera applications at which the upper limit of the threshold voltage distribution becomes less than the erase verify voltage Vev1 may be used to determine whether to perform the soft-programming operation in this embodiment. Referring now to FIG. 14A and FIG. 14C, a description is given below. As described above, the degraded memory cell MC may easily be written with data. Therefore, the threshold voltage before starting the erase operation of the degraded memory cell MC is higher than the threshold voltage before starting the erase operation of the undegraded memory cell MC. In this case, the degraded memory cell MC is positioned near the upper limit of the threshold voltage distribution. Here, the shift of the initial threshold voltage distribution (before its upper limit becomes less than the erase verify voltage Vev1) in the erase operation may be monitored to determine the degradation state of the memory cell. It is thus possible to more correctly determine the degradation state of the memory cell MC used as the reference to determine whether to perform the soft-programming operation. At step S13 in FIG. 14C, when the number N of erase voltage Vera applications at which the upper limit of the threshold voltage distribution becomes less than the erase verify voltage Vev1 is, for example, N≤3 or 7≥N, the soft-programming operation is not performed and the erase operation is ended. When the number N of erase voltage Vera applications is, for example, 3<N<7, the soft-programming voltage Vsp is applied to perform the soft-programming operation. Other steps S11 to S12 and S14 to S17 in FIG. 14C are similar to that of the operation of the first embodiment shown in FIG. 9.

Referring also to FIG. 14B, the number of erase voltage Vera applications at which the upper limit of the threshold voltage distribution becomes less than the erase verify voltage Vev1 may be used to determine whether to perform the soft-programming operation. Here, the step-up value ΔVera2 is less than the ΔVera. The step-up value ΔVera2 is set in order to finely adjust the threshold voltage immediately before the erase operation is ended. Specifically, the number of erase voltage Vera applications after the upper limit of the threshold voltage distribution becomes less than the erase verify voltage Vev1 is little related to the degradation of the memory cell MC. It is possible to correctly determine the degradation of the memory cell MC using the number of erase voltage Vera applications before the upper limit of the threshold voltage distribution becomes less than the erase verify voltage Vev1. Operation in this case is similar to that shown in flowchart in FIG. 14C.

Fourth Embodiment

Figure 15:
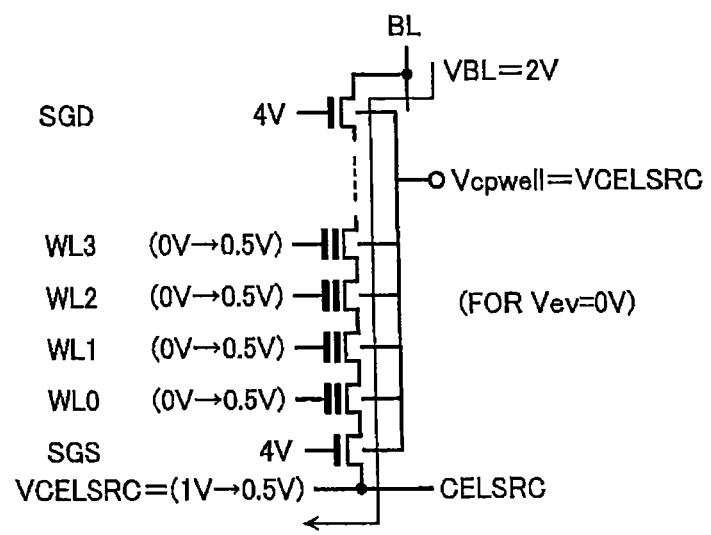
FIG. 15 illustrates voltages during an erase verify operation according to a fourth embodiment.
Figure 16:
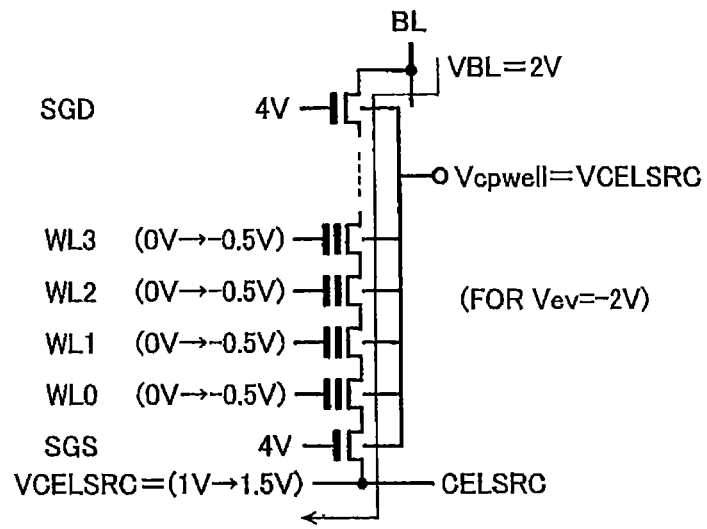
FIG. 16 illustrates voltages during an erase verify operation according to the fourth embodiment.
Figure 17:
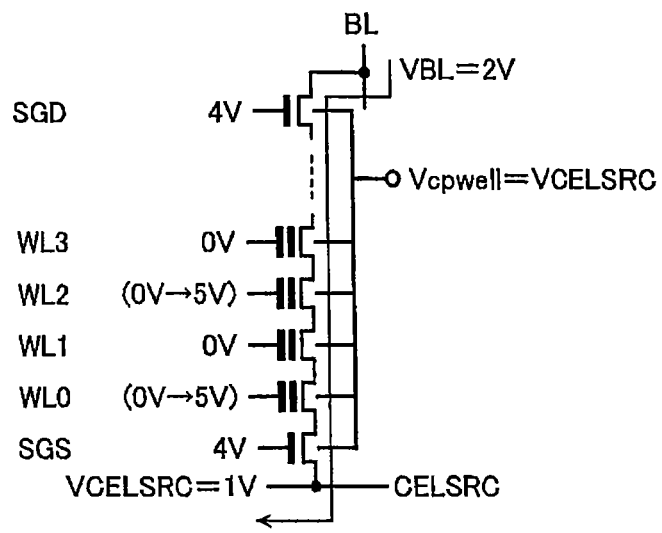
FIG. 17 illustrates voltages during an erase verify operation according to the fourth embodiment.

Referring now to FIG. 15 to FIG. 17, a non-volatile semiconductor memory device according to a fourth embodiment will be described below. The entire configuration of a non-volatile semiconductor memory device of this embodiment is similar to that in the first embodiment, and thus the detailed description is omitted here. Like elements as those in the first embodiment are designated by like reference numerals, and repeated description thereof is omitted here.

Also in this embodiment, the number of erase voltage Vera applications is used to control whether to apply the soft-programming voltage Vsp to perform the soft-programming operation as in the above embodiments. In the erase operations according to the second and third embodiments, the step-up value ΔVera of the erase voltage Vera is changed during the erase operation. In contrast, in this embodiment, the number of erase voltage Vera applications is used to change the set voltage during the erase verify operation. Referring now to FIG. 15 to FIG. 17 and FIG. 6 that shows the erase verify voltage in the first embodiment, a description is given below.

FIG. 6 shows the state of the erase verify voltage application in the first embodiment. Here, the source line voltage VCELSRC during the erase verify operation and the voltage of the selected word line WL may be changed depending on the erase operation situation. When, for example, the number of erase voltage Vera applications is more than a reference number (for example, 10), the source line voltage VCELSRC during the erase verify operation may be reduced or the voltage of the selected word line WL may be raised, as shown in FIG. 15. One or both of the above two different voltage-value changes may be performed. FIG. 15 shows an example of the voltage application state to read whether the memory cell MC is erased to the threshold voltage Vev (for example 0 V).

When the number of erase voltage Vera applications is more than a reference number (for example, 10), the source line voltage VCELSRC during the erase verify operation may be raised or the voltage of the selected word line WL may be reduced, as shown in FIG. 16. One or both of the above two different voltage-value changes may be performed. FIG. 16 shows an example of the voltage application state to read whether the memory cell MC is erased to the threshold voltage Vev (for example −2 V).

When the number of erase voltage Vera applications is more than a reference number (for example, 10), a scheme may be adopted in which the erase verify operations of the memory cells MC connected to even word lines WL or odd word lines WL may be performed individually as shown in FIG. 17. In this case, the word lines WL that are not subject to the erase verify operation are each applied with a voltage (for example, 5 V) by which the memory cell MC are reliably rendered conductive. After the erase verify operations of the memory cells MC connected to the even word lines WL and the memory cells MC connected to the odd word lines WL are performed, the two operation results are used to determine whether the verify is passed.

[Advantages]

Also in this embodiment, the number of erase voltage Vera applications is used to control whether to apply the soft-programming voltage Vsp to perform the soft-programming operation. This embodiment may thus provide advantages such as described in the above first embodiment.

The erase voltage step-up operation according to this embodiment may also provide the following advantages. When the erase verify operation is not passed even after a large number of erase voltage Vera applications, the memory cell MC is being degraded. In so doing, with reference to FIG. 15, the change of the applied voltage to raise the erase verify voltage Vev may end the erase operation more quickly, thereby suppressing the degradation of the memory cell MC. Further, a high erase verify voltage Vev may be set in advance to end the erase operation more quickly before the memory cell MC is degraded, while after the memory cell MC is degraded, a low erase verify voltage may be set, as shown in FIG. 16, to ensure the negative threshold voltage of the memory cell MC. Then, the erase verify operations of the memory cells MC connected to the even word lines WL or the odd word lines WL may be performed individually to correctly perform the erase verify operation. Note that the voltage of the erase verify operation is not limited to the voltage values shown in FIG. 15 to FIG. 17. It may be any voltage value that allows detecting that the threshold voltage of the memory cell MC is equal to or less than a certain erase verify voltage Vev.

Other Example

Figure 18:
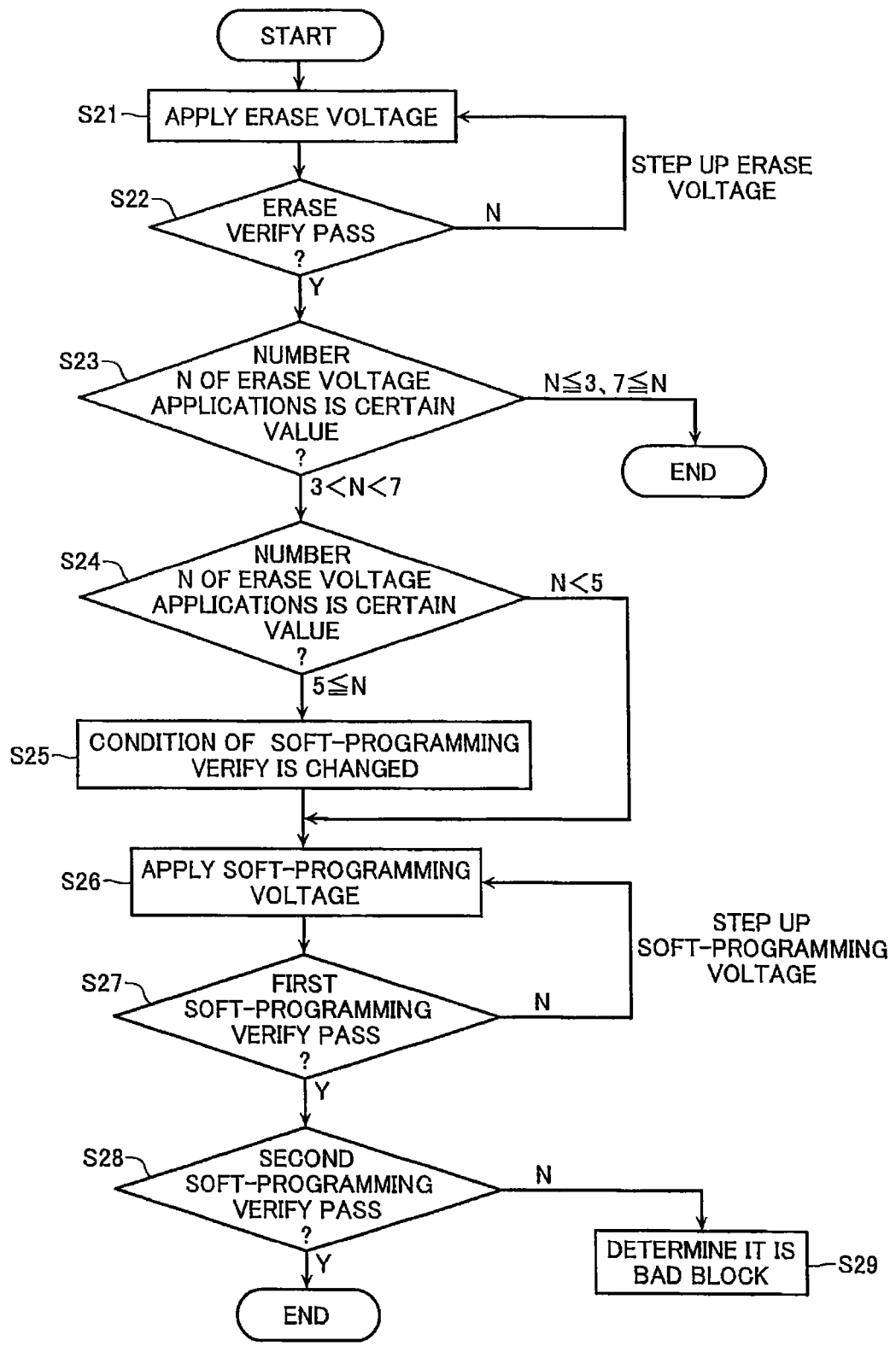
FIG. 18 is a flowchart illustrating an erase operation and a soft-programming operation according to the fourth embodiment.

Further, depending on the change of the erase verify voltage Vev as shown in FIG. 15, the condition of the first soft-programming verify may be changed. The condition of the first soft-programming verify may be changed by raising the first soft-programming verify voltage Vspv1 applied to the selected word line WL or by decreasing the source line voltage VCELSRC during the soft-programming verify. Referring now to FIG. 18, a description is given below.

FIG. 18 shows an example that when the number of erase voltage Vera applications is for example N≤3 or 7≥N, the soft-programming operation is not performed and the erase operation is ended, and when the number N of erase voltage Vera applications is for example 3<N<7, the soft-programming voltage Vsp is applied to perform the soft-programming operation. It is assumed that when the number N of erase voltage Vera applications is more than 5, the voltage of the selected word line WL during the erase verify operation is raised or the source line voltage VCELSRC is decreased.

In this case, when the number N of erase voltage Vera applications is 4, the source line voltage VCELSRC during the soft-programming verify operation or the voltage of the selected word line WL is not changed (N<5 of step S24). When the number N of erase voltage Vera applications is 5 to 6, the source line voltage VCELSRC during the soft-programming verify operation or the voltage of the selected word line WL is changed (5≤N of step S24). The source line voltage VCELSRC during the soft-programming operation or the voltage of the selected word line WL is changed (step S25).

In other words, the mismatch may be eliminated that the condition during the erase verify is relaxed, but the condition during the soft-programming verify is unrelaxed. The threshold distribution after the erase operation and the threshold distribution during the soft-programming operation may thus be appropriately determined.

OTHERS

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, although the above embodiments have been described with respect to a non-volatile semiconductor device that stores binary data or four-value data in one memory cell MC, it will be understood that the present invention is not limited thereto and is also applicable to a more bit storage scheme such as an eight-value storage scheme.

What is claimed is:

1. A non-volatile semiconductor memory device comprising:
   a memory cell array, the memory cell array comprising a memory string including a plurality of memory cells connected in series, a first select transistor connected to one end of the memory string, a second select transistor connected to the other end of the memory string, a bit line connected to the memory string via the first select transistor, a source line connected to the memory string via the second select transistor, and word lines connected to control gate electrodes of the memory cells, respectively; and
   a control unit configured to control a repeat of an erase operation, an erase verify operation, and a step-up operation, the erase operation being an operation of applying an erase voltage to the memory cells for data erase, the erase verify operation being an operation of determining whether a threshold voltage of the memory cells is not more than a certain voltage, the step-up operation being an operation of raising the erase voltage by a step-up value when the threshold voltage is more than the certain voltage with regard to at least a part of the memory cells,
   the step-up value being changed in the step-up operation when, in a series of the repeat of the erase operation, the erase verify operation, and the step-up operation, a number of erase operations exceeds a certain number,
   the control unit being configured to execute the erase verify operation after the erase operation which is performed after the step-up value is changed.

2. The non-volatile semiconductor memory device according to claim 1, wherein
   the step-up value is increased in the series of the repeat of the erase operation, the erase verify operation, and the step-up operation.

3. The non-volatile semiconductor memory device according to claim 1, wherein
   the step-up value is decreased in the series of the repeat of the erase operation, the erase verify operation, and the step-up operation.

4. The non-volatile semiconductor memory device according to claim 1, wherein
   the step-up value is changed multiple times in the series of the repeat of the erase operation, the erase verify operation, and the step-up operation.

5. A non-volatile semiconductor memory device comprising:
   a memory cell array, the memory cell array comprising a memory string including a plurality of memory cells connected in series, a first select transistor connected to one end of the memory string, a second select transistor connected to the other end of the memory string, a bit line connected to the memory string via the first select transistor, a source line connected to the memory string via the second select transistor, and word lines connected to control gate electrodes of the memory cells, respectively; and
   a control unit configured to control a repeat of an erase operation, an erase verify operation, and a step-up operation, the erase operation being an operation of applying an erase voltage to the memory cells for data erase, the erase verify operation being an operation of determining whether a threshold voltage of the memory cells is not more than a certain voltage, the step-up operation being an operation of raising the erase voltage by a step-up value when the threshold voltage is more than the certain voltage with regard to at least a part of the memory cells,
   the control unit being configured to control whether to perform a soft-programming operation of setting the memory cells from an over-erased state to a first threshold voltage distribution state according to a number of erase operations.

6. The non-volatile semiconductor memory device according to claim 5, wherein
   the step-up value is changed in the step-up operation when, in a series of the repeat of the erase operation, the erase verify operation, and the step-up operation, a number of erase operations exceeds a certain number.

7. The non-volatile semiconductor memory device according to claim 6, wherein
   the step-up value is increased in the series of the repeat of the erase operation, the erase verify operation, and the step-up operation.

8. The non-volatile semiconductor memory device according to claim 6, wherein
   the step-up value is decreased in the series of the repeat of the erase operation, the erase verify operation, and the step-up operation.

9. The non-volatile semiconductor memory device according to claim 6, wherein
   the step-up value is changed multiple times in the series of the repeat of the erase operation, the erase verify operation, and the step-up operation.

10. The non-volatile semiconductor memory device according to claim 5, wherein
    the control unit is configured to change a set voltage of the erase verify operation.

11. The non-volatile semiconductor memory device according to claim 10, wherein
    the control unit is configured to change a set voltage of the soft-programming operation.

12. A non-volatile semiconductor memory device comprising:
    a memory cell array, the memory cell array comprising a memory string including a plurality of memory cells connected in series, a first select transistor connected to one end of the memory string, a second select transistor connected to the other end of the memory string, a bit line connected to the memory string via the first select transistor, a source line connected to the memory string via the second select transistor, and word lines connected to control gate electrodes of the memory cells, respectively; and
    a control unit configured to control a repeat of an erase operation, an erase verify operation, and a step-up operation, the erase operation being an operation of applying an erase voltage to the memory cells for data erase, the erase verify operation being an operation of determining whether a threshold voltage of the memory cells is not more than a certain voltage, the step-up operation being an operation of raising the erase voltage by a step-up value when the threshold voltage is more than the certain voltage with regard to at least a part of the memory cells, after a series of the repeat of the erase operation, the erase verify operation, and the step-up operation is completed, when a number of erase operations in the series of the repeat has been a first number, the control unit is configured to perform a soft-programming operation of setting the memory cells from an over-erased state to a first threshold voltage distribution state and after the series of the repeat of the erase operation, the erase verify operation, and the step-up operation is completed, when the number of erase operations in the series of the repeat has been a second number, the control unit is configured not to perform the soft-programming operation, the second number being different from the first number.

13. The non-volatile semiconductor memory device according to claim 12, wherein
the step-up value is changed in the step-up operation when, in the series of the repeat of the erase operation, the erase verify operation, and the step-up operation, a number of erase operations exceeds a certain number.

14. The non-volatile semiconductor memory device according to claim 13, wherein
the step-up value is increased in the series of the repeat of the erase operation, the erase verify operation, and the step-up operation.

15. The non-volatile semiconductor memory device according to claim 13, wherein
the step-up value is decreased in the series of the repeat of the erase operation, the erase verify operation, and the step-up operation.

16. The non-volatile semiconductor memory device according to claim 13, wherein
the step-up value is changed multiple times in the series of the repeat of the erase operation, the erase verify operation, and the step-up operation.

17. The non-volatile semiconductor memory device according to claim 12, wherein
the control unit is configured to change a set voltage of the erase verify operation.

18. The non-volatile semiconductor memory device according to claim 17, wherein
the control unit is configured to change a set voltage of the soft-programming operation.

* * * * *